United States Patent [19]

Goth et al.

[11] Patent Number: 5,005,638
[45] Date of Patent: Apr. 9, 1991

[54] THERMAL CONDUCTION MODULE WITH BARREL SHAPED PISTON FOR IMPROVED HEAT TRANSFER

[75] Inventors: Gary F. Goth, Pleasant Valley; Kevin P. Moran, Wappingers Falls; Michael L. Zumbrunnen, Poughkeepsie, all of N.Y.

[73] Assignee: International Business Machines Corporation, New York, N.Y.

[21] Appl. No.: 265,065

[22] Filed: Oct. 31, 1988

[51] Int. Cl.[5] ............................. F28F 7/00; H05K 7/20
[52] U.S. Cl. ................................. 165/80.4; 165/185; 357/81; 361/386
[58] Field of Search ...................... 165/80.2, 80.4, 185; 174/16.3; 357/81, 82; 361/386

[56] References Cited

U.S. PATENT DOCUMENTS

| | | | |
|---|---|---|---|
| 3,366,171 | 1/1968 | Scharli | 165/185 X |
| 4,156,458 | 5/1979 | Chu et al. | 165/81 |
| 4,235,283 | 11/1980 | Gupta | 165/80 |
| 4,462,462 | 7/1984 | Meagher et al. | 165/80 C |
| 4,639,829 | 1/1987 | Ostergren et al. | 361/386 |
| 4,765,400 | 8/1988 | Chu et al. | 165/185 |
| 4,908,695 | 3/1990 | Morihara et al. | 357/81 |

OTHER PUBLICATIONS

*Research Disclosure* No. 251, Mar. 1985, Kenneth Mason Publications Ltd., England.
IBM Technical Disclosure Bulletin, vol. 21, No. 8, Jan. 79, pp. 3211-3212—"Thermal Conduction Piston for Semiconductor Packages" by L. Landstein.
IBM Technical Dislosure Bulletin, vol. 21, No. 11, Apr. 79, p. 4493—"Liquid Piston Tip" by P. Ginnings and J. Lynch.
IBM Technical Disclosure Bulletin, vol. 23, No. 4, p. 1400, 9/80, "Self-Aligning Heat Transfer Pad for Pad--Mounted Chips" by R. Durand et al.
IBM Technical Disclosure Bulletin, vol. 20, No. 8, pp. 3131/3132, 1/78, "Articulated Thermal Conductor for Semiconductor Chip Packages" by L. V. Gregor et al.
IBM Technical Disclosure Bulletin, vol. 23, No. 12, p. 5489, 5/81, "Gimbal-Suspended Cooling Piston", by W. Otte et al.

*Primary Examiner*—Allen J. Flanigan
*Attorney, Agent, or Firm*—Richard M. Ludwin

[57] ABSTRACT

An otherwise conventional multi-chip circuit module called a thermal conduction module (TCM) is provided with "barrel shaped" pistons that give improved cooling for chips that may be tilted with respect to their pistons. The piston has a cylindrical mid-section and tapered end sections. The barrel shape permits the piston to tilt with the chip even though the mid-section has the desirable close fit of conventional convex face pistons. The length of the mid-section is selected to permit the piston to tilt to the angle of the taper of the ends. Because the piston can tilt with the chip, the end that contacts the chip is flat for good heat transfer. The result is improved heat transfer by a lower combined thermal resistance of the gap between piston and chip and the gap between piston and hat versus conventional pistons.

10 Claims, 3 Drawing Sheets

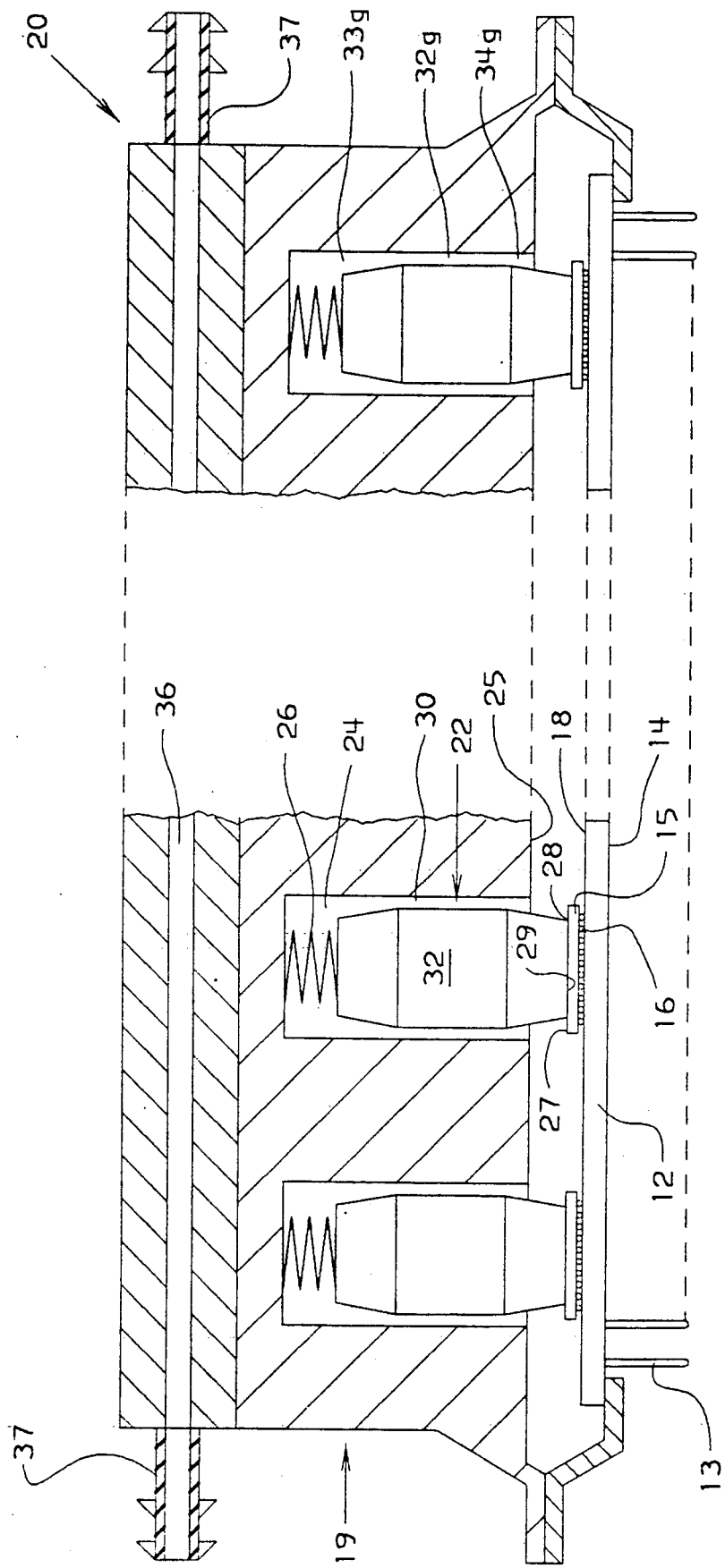

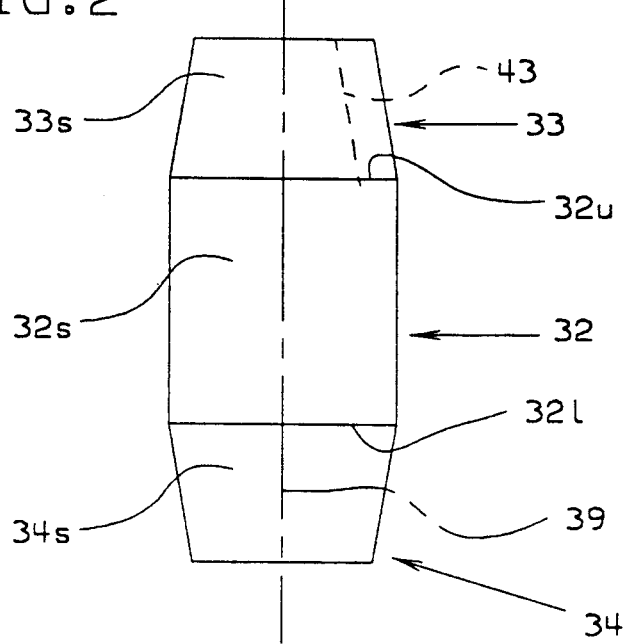
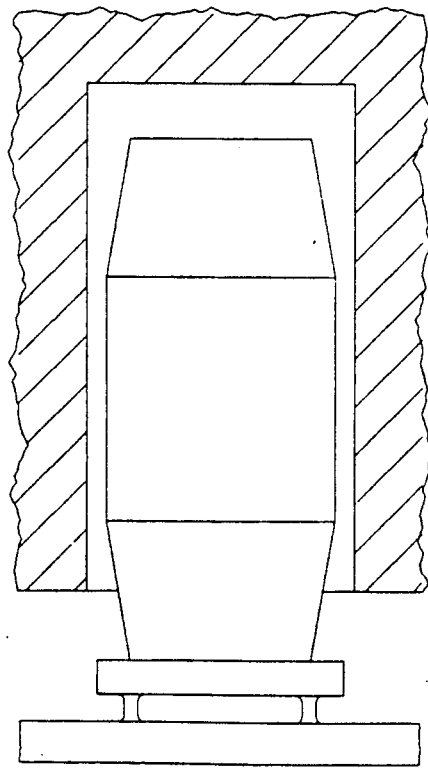
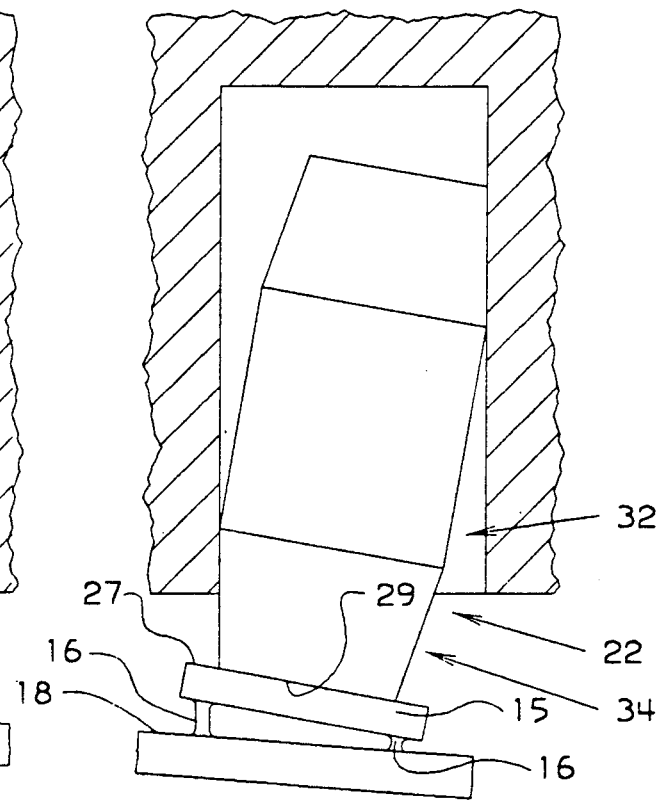

-48

49--

THERMAL CONDUCTION MODULE WITH BARREL SHAPED PISTON FOR IMPROVED HEAT TRANSFER

This invention relates to a multi-chip circuit module with improved apparatus for cooling components such as semiconductor chips by conduction through metal components called pistons.

INTRODUCTION

A module of this general type is commonly called a thermal conduction module or TCM. A TCM has a planar substrate that holds an array of about 100 semiconductor chips. For terminology, it will be convenient to suppose that the substrate is oriented arbitrarily in a horizontal plane with the chips mounted on the upper surface. Pins extend from the lower surface of the substrate for plugging the module into a circuit board. The chips produce heat, and from a more general standpoint they constitute heat producing components. A structure called a hat is attached to the substrate and cooperates with the substrate to form an enclosure for the chips. The hat is made of a heat-conductive material such as copper or aluminum and is cooled by any suitable cooling means such as a cold plate that carries chilled water. The module is called a "thermal conduction" module because heat is transferred from the chips by conduction through cylindrical metal pistons. The upper part of each piston is located in a downwardly open cylindrical hole in the hat, and a spring above the piston urges the piston downward with its lower face in a heat transferring contact with the associated chip. Heat from the chip flows up through the piston, across to the hat, and through the hat to the cooling means.

The pistons are made separable from the chips and movable in the hat because this construction simplifies the manufacturing and assembly and testing of the TCM. However, in this organization of the module a gap exists between the piston and the chip (called the interface gap) and a gap exists between the piston and the hat (called the radial gap), and these gaps account for a substantial part of the thermal resistance of the module. The resistance is significant because the temperature difference between the chips and the cooling means is substantially fixed: the chips must operate at a particular temperature, and the water can be chilled only to an allowable temperature. Thus, it is a general object in this art to reduce the resistance of the two gaps.

Commercial modules are filled with helium to provide better conduction across the two gaps, and materials with higher thermal conductivity have been proposed (oil, thermal grease). Any of these techniques can be used with our module.

The two gaps become wider and/or more extensive if the axis of the piston is not exactly perpendicular to the upper surface of the chip. This non-perpendicularity comes about from tolerances in the chip supporting structure and in the piston supporting structure. The substrate surface that carries the chips is not exactly flat. The chip is attached to electrical pads on the substrate with solder balls, and the chip may be tilted with respect to the substrate surface by variations in the soldering process. The maximum tilt of the chip with respect to a reference plane for the substrate is on the order of a degree or less. The holes in the hat may not be exactly perpendicular to a reference plane for the hat, and the hardware components that connect the hat and the substrate may not hold the hat reference plane parallel to the substrate reference plane. These differences may be a few tenths of a degree.

Thus, some pistons in a module may be substantially perpendicular to the associated chip and others may be nonperpendicular by about a degree or less. The term "chip tilt" and the more general term "component tilt" will be used in this specification to mean the sum of these angular tolerances (and not just the tilt of the chip with respect to the reference plane of the substrate).

A value of maximum chip tilt can be specified for a module. Two techniques are commonly used for making tolerance calculations of this type. The maximum value for each tolerance can be added, or a statistical function of each tolerance value can be added. The statistical function gives a lower numerical value. It will be convenient to use the maximum tolerance values in examples, but the choice is not significant to our invention, and the terms "tilt" and "maximum tilt" will be used in this specification without limit to the way in which the values are established.

THE PRIOR ART

One object of this invention is to achieve a small interface gap between a piston and a chip that may be tilted and at the same time to achieve a small radial gap between the sides of the piston and the wall of the cylindrical hole for the piston in the hat.

In commercially available modules, the pistons fit inside the cylindrical holes with the minimum space to permit up and down motion, and these pistons are held substantially perpendicular to the plane of the substrate (neglecting the tolerances in the piston supporting structure). The lower surface of the piston is made convex so that some point on this surface will contact the chip regardless of chip tilt. The limited area of contact between the piston and the chip limits the heat that the module can handle.

Our module uses a proposal of the prior art in which the lower face of the piston is made flat for a wide area of thermal contact with the back of the chip. In modules with this feature, the axis of piston must tilt with respect to the axis of the hole at the angle of chip tilt. The prior art has proposed increasing the spacing between the piston and the wall of the hole to let the piston tilt to the angle of the chip. However, the increased radial gap between the piston and the hat would increase its thermal resistance.

The prior art has also proposed a swiveling piston structure that keeps the tight clearance between the upper part of the piston and the wall of the hole but allows the lower face of the piston to lie flat against the chip.

Several TCM-like devices have other structures that reduce the thermal resistance of the gap by increasing the area of the gap.

SUMMARY OF THE INVENTION

In our module, the pistons are conventionally cylindrical at a mid-section and the ends are tapered at a slight angle. The diameter of the piston at its mid-section is selected with respect to the inside diameter of the cylindrical hole to provide a suitable clearance for up and down motion, as in the prior art. The length of the mid-section is selected to permit the piston to tilt at the angle of maximum chip tilt. At maximum tilt and with the hole diameter at its minimum tolerance and the piston diameter at its maximum tolerance condition, the upper circumference of the mid-section contacts the inside wall at one point and the lower circumference of the mid-section contacts the inside wall at a diagonally and diametrically opposite point.

The taper at the ends of the piston is at the angle of maximum chip tilt to allow the tapered sections to lie along the inside walls at diagonally and diametrically opposite lines. This structure provides improved heat transfer from the piston to the hat for a chip up to its maximum tilt, while maintaining a flat interface gap to the chip.

In our module, the lowest thermal resistance occurs for a chip at maximum tilt with largest piston and smallest hole and the highest resistance occurs for a chip with zero tilt, smallest piston and largest hole. So long as the chip tilt is less than the maximum tilt, the barrel shaped piston has improved thermal performance because the total resistance of the interface gap plus the resistance of the radial gap is reduced.

The description of the preferred embodiment of our invention will explain the module more specifically in relation to the tolerances of the module and will suggest several modifications.

THE DRAWINGS

FIG. 1 is a section view of our thermal conduction module.

FIG. 2 is a drawing of a piston with lines designating sections of the piston that will be identified separately in the description.

FIG. 3 shows a section of our thermal conduction module with a chip and piston at zero tilt.

FIG. 4 is similar to FIG. 3 and shows a chip and piston at maximum tilt. The tilt of the chip and the taper of the piston is greatly exaggerated in the drawing.

THE PREFERRED EMBODIMENT

FIGURE 1—Conventional Features

Figure 5:
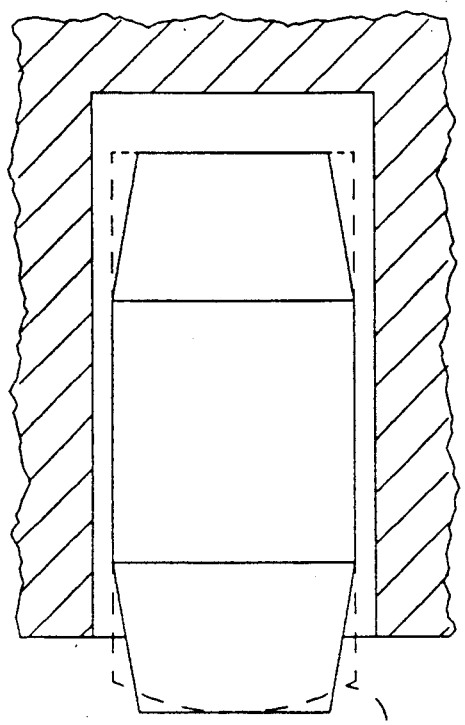
FIG. 5 shows a section of our thermal conduction module similar to FIG. 3 with a conventional piston having a domed end superimposed on the barrel shaped piston.

FIG. 1 shows our thermal conduction module with barrel shaped pistons. The module has a substrate 12, pins 13 extending from the substrate lower surface 14, chips 15, solder balls 16 that connect the chips electrically and mechanically to pads (not shown) on the upper surface 18 of the substrate, a hat 19 that is attached to the substrate, a cooling means 20, the barrel shaped pistons 22 which are located in blind holes 24 in the lower surface 25 of the hat, and springs 26 that urge the pistons downward in contact with the upper surfaces 27 chips. The piston may have a hole in the top to receive the spring.

An interface gap 28 exists between the lower face 29 of the piston and the upper surface 27 of a chip, and a radial gap 30 exists between the side of the piston and the cylindrical wall of hole 24. Reference characters 32–34 with several suffixes divide the piston and the associated radial gap 30 into components for the later detailed description. FIG. 1 realistically represents the interface gap 28 as microscopic and greatly exaggerates the radial gap 30. Heat from a chip 15 flows across the interface gap 28, through the associated piston 22, across the radial gap 30 to hat 19, and through the hat 19 to the cooling means 20.

The chip supporting surface 18 of the substrate is sufficiently uneven to contribute to chip tilt, and the flat surface 18 represented in the simplified drawing of FIG. 1 corresponds to a reference plane for the positions of the upper surfaces 27 of the chips. In one commercial module, a flange on the lower surface the substrate defines this plane. Similarly, surface 25 represents a possible reference plane that is suitably provided for the hat.

The bottoms of the holes have a radius and the ends of the pistons are correspondingly chamfered, as is conventional but not shown in the drawing. The pistons can have other conventional features such as vent holes that permit the piston to be inserted into a hole that contains a thermal grease.

Except for the barrel shaped pistons, the components of FIG. 1 are conventional and are shown schematically to emphasize that our invention can be used with various modules. The cooling means 20 is shown as a separable cold plate that carries chilled water in a channel 36 that extends between inlet and outlet connections 37. FIG. 1 illustrates a module with a third gap between the hat 19 and the cold plate 20, but this gap is not relevant to the invention and will not be referred to in the discussion of the heat transfer paths. (The location of the cooling means in relation to the pistons is discussed later.)

The Barrel Shaped Piston—FIGURE 2

The axis of the piston is shown by a dashed line 39. The piston has a mid-section 32, an upper tapered section 3, and a lower tapered section 34. The surfaces of these sections have the same reference character with the suffix "s". The associated radial gaps are designated by the suffix "g" in FIG. 1.

The cylindrical surface 32s of mid-section 32 is bounded by an upper circumferential edge 32u and a lower circumferential edge 32l.

The upper tapered section 33 and the lower tapered section 34 have equal tapers at a predetermined angle with respect to the axis 39. A representative conical slant line 43, shown dashed, lies at the intersection of conical surface 33s and a plane (not shown) that passes through the axis 39.

FIGURES 3 and 4

FIG. 4 shows a chip 15 tilted with its upper surface 27 at the angle of maximum chip tilt with respect to the reference plane of the substrate. Part of the tilt is attributable to a local variation in the substrate surface 18 and part is attributable to a variation in the process of bonding the chip to the surface. The spring 26 (FIG. 1) pushes piston 22 downward with its lower surface 29 flat against the upper surface 27 of the chip. Consequently, the axis of the piston is tilted with respect to the axis of hole 24 at the angle of chip tilt. In FIG. 3, the chip and the piston have zero tilt. A chip can have the maximum tilt of FIG. 4 or the minimum tilt of FIG. 3 or any intermediate value of tilt, and the general case can be understood from the following description of FIGS. 3 and 4.

FIGS. 3 and 4 also illustrate local differences in the height of the substrate surface with respect to the reference surface shown in FIG. 1. This variation affects the conventional design of the module, the hole must be deep enough. The tapered lower surface 34s of barrel shape piston provides a minimum radial gap for each substrate height while accommodating chip tilt.

The piston diameter and the axial lengths of its three sections 32, 33 and 34 are given values to establish the optimum heat transfer for various angles of tilt. The heat flow through the piston can be thought of as having three parts. Part flows across the radial gap 32g at the cylindrical mid-section and parts flow through the radial gaps 33g and 34g at the tapered sections. When the heat path is represented by a network of thermal resistances, the gaps can be represented as the resistance of the material filling the gaps in parallel with the resistance of a few metal-to-metal contact points.

The Dimensions of the Module—Conventional Features

The mid-section of 32 by itself can be understood by the analysis for a conventional cylindrical piston. In a module with a conventional cylindrical piston with convex face, the radial gap is made as small as feasible to reduce its thermal resistance and it is just sufficient to permit the piston to move in the hole when the module is assembled. The mid-section 32 preferably has the minimum feasible radial gap. The piston and the hole have manufacturing tolerances, and the dimensions will allow a piston of maximum diameter to move freely in a hole of minimum diameter.

Some of the dimensions of the piston are established by factors that are not directly related to the barrel shape or are established by factors that are only partly affected by the barrel shape. For example, the module will be adapted for chips of a particular size having a particular maximum power and normally operating at a particular temperature.

Various known factors establish the vertical spacing between the bottom surface of the hat and the tops of the chips. For example, the spacing should be as small as possible to limit the thermal resistance of the section of the piston that extends into this space. On the other hand, some space is needed for manufacturing tolerance, and some modules may have components such as capacitors that require more vertical space than chips.

The depth of the piston hole in the hat is based on a conventional analysis of the heat flow through the piston and the hat. The related dimensions are selected to optimize the heat flow. For example, a deep hole and a long piston provide more area at the radial gap. On the other hand, this advantage is limited by the added resistance of the longer piston and the longer path through the hat. The conductivities of the hat, piston, and gap materials also determine the optimum hole depth.

Note in the module of FIG. 1 that the cooling means 20 is located above the cylindrical holes 24, and the the heat flow is generally upward. The prior art has proposed locating water passages between the cylindrical holes, and in such a module some of the heat flow would be laterally into these passages. Adapting the barrel shaped piston to such a module will be readily understood from this specification.

The piston is given a diameter to adapt to the width of the chip, to the spacing between chips, and to the requirement that the space in the hat between holes must be be sufficient to conduct heat and/or to circulate a coolant. As is conventional and not shown in the drawing, the lower end of the piston can be extended laterally beyond the shape shown in the drawing to better cover the chip.

Dimensions of the Piston and Hat

The lower tapered section 34 is made at least long enough that some part of this section is located inside the cylindrical hole, as will be discussed later. Accordingly, the cylindrical mid-section 32 is located entirely within the cylindrical hole. The mid-section is made long enough so that the upper and lower circumferential rims 33u and 33l may contact the sides of the hole 24 when the chip and piston are at the angle of maximum tilt. Considering manufacturing tolerances, a piston with the maximum diameter and the maximum mid-section axial length preferably will tilt to the maximum angle in a hole of minimum diameter. It is an advantage of this disclosure that the piston can tilt to the maximum angle maintaining a flat interface gap even though the close spacing of a conventional module is maintained in the mid-section.

For a chip with zero tilt, as in FIG. 3, the axis of the piston is parallel to the axis of the hole, as in a conventional module with a cylindrical piston. As is true for a conventional module, the heat flow is analyzed for the case in which the axis of the piston coincides with the axis of the hole because the radial gap has a maximum resistance in this case. (The radial gap resistance is reduced if the piston touches the wall of the hole or is located closer to the wall.)

The Tapered Sections

The remaining length of the piston is divided between the two tapered sections 33 and 34. In a limiting case, either tapered section has a length of zero. However, from the analysis that has been presented earlier the optimum heat flow occurs when the lower tapered section 34 that is inside the hole is slightly shorter than the upper tapered section 33.

Figure 6:
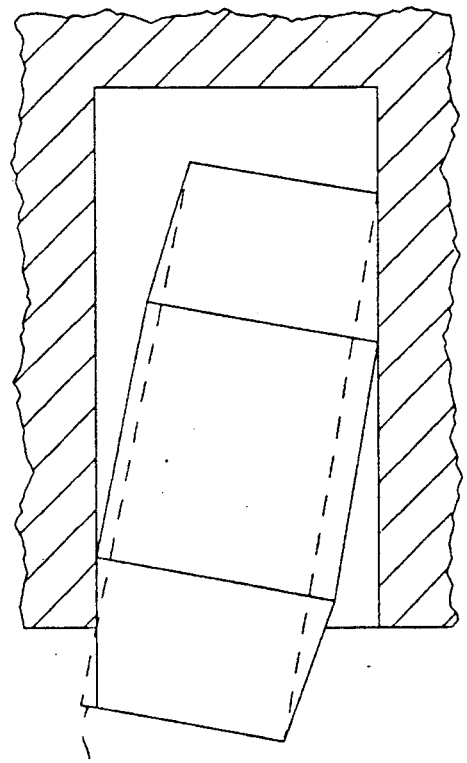
FIG. 6 is similar to FIG. 4 and shows a conventional piston having a flat end superimposed on the barrel shaped piston.

FIGURES 5 and 6

In FIG. 5, a conventional cylindrical piston with a domed end 48 is shown superimposed on the barrel shaped piston. The barrel shaped piston is shown in solid lines as in FIG. 3 and the cylindrical piston is shown in dashed lines where it does not coincide with the barrel shaped piston. The cylindrical piston does not tip: its axis is aligned with or parallel to the axis of the cylindrical hole. Accordingly, the cylindrical piston has a maximum diameter and a minimum radial gap for good heat transfer. The domed face permits the cylindrical piston to contact a tilted chip but makes contact over only a limited area. The cylindrical mid-section of the barrel shaped piston has the desirable narrow radial gap of the conventional cylindrical piston, and the barrel shaped piston has a wide area of contact at the interface gap.

In FIG. 6, the conventional cylindrical piston has a flat end 49 that makes good contact with the chip. The diameter of the cylindrical piston is reduced, as compared with the cylindrical piston or the barrel shaped piston of FIG. 5, so that it can tilt in the hole. Accordingly, it has a wide radial gap and reduced thermal performance. The barrel shaped piston has the desirable flat end of this cylindrical piston, its mid-section has the desirable small radial gap, and it provides good contact with the side of the hole in the position of maximum tilt shown in FIG. 6.

Other Embodiments

It is conventional to make some part of the hat or the pistons of aluminum that is anodized for electrical insulation. The choice of these materials affects the length of the pistons, but the known design techniques can readily be applied to the preceding description.

In the preferred embodiment, the taper of the barrel shaped piston is flat—the tapered sections are truncated cones. From the standpoint of some manufacturing techniques, it may be desirable to make the surfaces 33s and 34s of the tapered sections slightly rounded instead of flat. A piston at the maximum tilt would make less contact with the hat than the piston shown in FIG. 4 and it would have poorer thermal performance. However, the heat transfer is reduced only slightly if the curve is slight, and the thermal performance may be adequate for some applications.

The module has been described for the case in which the widest piston in the narrowest hole will tilt to the angle of maximum chip tilt and thereby maintain its lower face in parallel contact with the chip, as in FIG. 4. Since this is the best case for heat transfer, the design can be modified to allow the lower face of the piston to lift slightly in this case: the angle of maximum chip tilt before lift, as established by the angle of the taper and the length of the mid-section, can be slightly less than the maximum angle to which some chip might tilt.

In a module described in U.S. Pat. No. 4,765,400 to Chu, Eid and Zumbrunnen, a plate contacts the back of the chip, and heat from the plate is transferred to the hat through an array of pins that fit into holes in the upper surface of the plate. The pins have enough clearance in the holes for the plate to take on the tilt of the chip. This clearance can be reduced and heat transfer for a tilted chip can be improved by tapering the ends of the pins in the way described for the barrel shaped piston.

U.S. Pat. No. 4,498,530 to Louis D. Lipschultz shows a module with interleaved vertical plates that form a piston-like structure. The lower plates contact the piston and the upper plates are attached to the hat. These plates may be rigid with gaps that permit the lower plates to adjust to chip height and tilt. If the free ends of the plates (as seen in Lipschultz FIG. 3) are tapered in the way described for the barrel shaped piston, the structure provides improved heat transfer for a tilted chip.

From this description of a preferred embodiment and several specific modifications, those skilled in the art will recognize various applications for our invention and appropriate modifications within the spirit of the invention and the scope of the claims.

Having thus described our invention, what we claim as new and desire to secure by Letters Patent is:

1. A circuit module of the type having:
    a substrate, heat producing components such as semiconductor chips mounted in an array of component sites on a surface of the substrate, the substrate being oriented for terminology in a horizontal plane with the surface facing up, the components having an upper substantially flat surface,
    a hat of thermally conductive material cooperating with the substrate to form an enclosure for the heat producing components, and means such as a cold plate for removing heat from the hat, the hat having blind cylindrical holes of a predetermined diameter each facing an associated component site, the axis of each hole being perpendicular to the upper flat surface of an associated component within a predetermined maximum angle of component tilt,
    wherein the improvement comprises,
    pistons each having a cylindrical section and a section tapered at a predetermined angle from the cylindrical section and having a lower flat face perpendicular to the axis of the piston, each piston including the cylindrical section and at least a portion of said tapered section being in one of the cylindrical holes, means for each piston against the associated component with the flat face of the piston in contact with the surface of the component for heat transfer,
    the cylindrical section of each piston having a predetermined diameter related to the diameter of the cylindrical hole to provide sufficient clearance for motion within the cylindrical hole and having a predetermined length to permit the piston to tip to said angle of piston taper,
    whereby if a component is tilted at an angle equal to or less than the angle of taper, the lower face of the associated piston is in parallel contact with the surface of the component.

2. The thermal conduction module of claim 1 wherein the angle of taper is substantially equal to the angle of maximum component tilt, whereby the lower face of each piston is in parallel contact with the surface of the associated component.

3. The thermal conduction module of claim 1 wherein the tapered section of at least one of said pistons lies along the wall of the cylindrical hole for improved heat transfer when the piston is tilted at the angle of the taper.

4. The thermal conduction module of claim 2 wherein the tapered section of each piston tapers away from the cylindrical section, whereby sections perpendicular to piston axis are circular.

5. The thermal conduction module of claim 1 wherein the cylindrical section of each piston has an axial length related to the inside diameter of the hole to cause diagonally opposite points on the upper and lower circumferences of the cylindrical section to contact the the side of the hole and for said tapered section to lie along the wall of a minimum diameter hole when a maximum diameter piston has said predetermined tilt, whereby maximum heat transfer occurs for a component with said predetermined tilt.

6. The thermal conduction module of claim 5 wherein each piston has a second section tapering from the circumference of the cylindrical section at said predetermined angle, whereby the upper and lower tapered sections lie along the wall of the cylinder on diametrically opposite lines when each piston is at the predetermined angle of tilt.

7. The thermal conduction module of claim 6 wherein the lower tapered section of each piston is shorter than the upper tapered section of each piston for optimum heat transfer from a component.

8. The thermal conduction module of claim 1 wherein the radial gap between piston and hole wall has one or two tapered annulus sections and a cylindrical annulus section which accommodate chip tilt and free assembly, whereby the lower face of each piston is in parallel contact with the associated component.

9. The thermal conduction module of claim 1 wherein each of said pistons further comprises an upper tapered section and a chamfer at upper face for guidance in assembly into the hole.

10. The thermal conduction module of claim 6 wherein the tapers are of unequal angles or slightly rounded.

* * * * *